(12) United States Patent
Todorokihara

(10) Patent No.: US 9,026,403 B2
(45) Date of Patent: May 5, 2015

(54) FREQUENCY MEASUREMENT DEVICE AND ELECTRONIC DEVICE

(75) Inventor: Masayoshi Todorokihara, Munich (DE)

(73) Assignee: Seiko Epson Corporation, Tokyo (JP)

( * ) Notice: Subject to any disclaimer, the term of this patent is extended or adjusted under 35 U.S.C. 154(b) by 554 days.

(21) Appl. No.: 13/211,726

(22) Filed: Aug. 17, 2011

(65) Prior Publication Data
US 2012/0053903 A1    Mar. 1, 2012

(30) Foreign Application Priority Data
Aug. 31, 2010    (JP) .................... 2010-194728

(51) Int. Cl.
*G01R 23/10*    (2006.01)

(52) U.S. Cl.
CPC ...................... *G01R 23/10* (2013.01)

(58) Field of Classification Search
CPC ............. G01N 2291/014; G01N 2291/021; G01N 29/022; G01N 29/223; H03H 2003/0428; H03H 9/0542; H03H 9/1007; H03H 9/1021; H03H 9/132
See application file for complete search history.

(56) References Cited

U.S. PATENT DOCUMENTS

| | | | |
|---|---|---|---|
| 2,627,033 A | 1/1953 | Jensen et al. | |
| 2,840,812 A | 6/1958 | Di Giacomo | |
| 2,944,219 A | 7/1960 | Tanaka et al. | |
| 3,026,473 A | 3/1962 | De Mott | |
| 3,056,085 A | 9/1962 | James et al. | |
| 3,144,623 A | 8/1964 | Steiner | |
| 3,227,952 A | 1/1966 | Proebster et al. | |
| 3,310,660 A | 3/1967 | Cogar | |
| 3,372,346 A | 3/1968 | Rogers et al. | |
| 3,407,290 A | 10/1968 | Atrubin | |
| 3,440,617 A | 4/1969 | Lesti | |

(Continued)

FOREIGN PATENT DOCUMENTS

| | | |
|---|---|---|
| CN | 1862263 A | 11/2006 |
| EP | 0 484 629 A2 | 5/1992 |

(Continued)

OTHER PUBLICATIONS

Alcazar, Relationship Between Sampling Rate and Quantization Noise, IEEE, 2002.*

(Continued)

*Primary Examiner* — Mischita Henson
*Assistant Examiner* — Kyle R Quigley
(74) *Attorney, Agent, or Firm* — David J. Zibelli

(57) ABSTRACT

A frequency measurement device includes: a reference signal source generating a reference signal; a frequency divider/multiplier section generating a frequency division/multiplication reference signal obtained by dividing or multiplying the reference signal by a prescribed frequency division or multiplication ratio; a first counter section outputting a first count value obtained by measuring the edge of the measurement signal observed within a prescribed period determined based on the frequency division/multiplication reference signal; a first low-pass filter removing a high-frequency component included in the first count value; a coefficient deriving section deriving a conversion coefficient based on the frequency division or multiplication ratio; and a conversion section multiplying an output value of the first low-pass filter by the conversion coefficient or the reciprocal of the conversion coefficient.

6 Claims, 6 Drawing Sheets

(56) References Cited

U.S. PATENT DOCUMENTS

| | | |
|---|---|---|
| 3,486,007 A | 12/1969 | Jacobson |
| 3,551,826 A | 12/1970 | Sepe |
| 3,553,579 A | 1/1971 | Teixeira |
| 3,557,796 A | 1/1971 | Keller et al. |
| 3,605,017 A | 9/1971 | Chertok et al. |
| 3,609,308 A | 9/1971 | Lemon et al. |
| 3,624,494 A | 11/1971 | Turan |
| 3,652,838 A | 3/1972 | Dillon et al. |
| 3,686,565 A | 8/1972 | Kelem et al. |
| 3,697,870 A | 10/1972 | Brenner |
| 3,704,414 A | 11/1972 | Herbst |
| 3,708,686 A | 1/1973 | Butler, Jr. et al. |
| 3,733,471 A | 5/1973 | Gilberg |
| 3,736,510 A | 5/1973 | Wu |
| 3,742,353 A | 6/1973 | Parisi |
| 3,743,940 A | 7/1973 | Yamagata |
| 3,745,380 A | 7/1973 | Kitajima et al. |
| 3,750,014 A | 7/1973 | Gaw |
| 3,755,734 A | 8/1973 | Blanyer |
| 3,761,740 A | 9/1973 | Naïve |
| 3,766,818 A | 10/1973 | Prohofsky |
| 3,775,681 A | 11/1973 | Konrad |
| 3,777,121 A | 12/1973 | Jamieson |
| 3,780,346 A | 12/1973 | Gagnon |
| 3,795,771 A | 3/1974 | Gundersen et al. |
| 3,803,487 A | 4/1974 | Iten |
| 3,812,427 A | 5/1974 | Coulter |
| 3,823,374 A | 7/1974 | Dandliker et al. |
| 3,838,338 A | 9/1974 | Khoury |
| 3,875,518 A | 4/1975 | Odams |
| 3,930,199 A | 12/1975 | Valis |
| 3,942,123 A | 3/1976 | Georgi |
| 3,943,460 A | 3/1976 | Arai |
| 4,041,387 A | 8/1977 | Dalichow et al. |
| 4,051,434 A | 9/1977 | Sweet |
| 4,053,839 A | 10/1977 | Knoedl |
| 4,063,169 A | 12/1977 | Palmer |
| 4,130,799 A | 12/1978 | Cherry |
| 4,137,497 A | 1/1979 | Lowenschuss |
| 4,139,819 A | 2/1979 | Worley |
| 4,139,870 A | 2/1979 | Tachi |
| 4,144,490 A | 3/1979 | Stevens |
| 4,150,432 A | 4/1979 | Sorden |
| 4,169,213 A | 9/1979 | Dye et al. |
| 4,310,891 A | 1/1982 | Niki |
| 4,339,722 A | 7/1982 | Sydor et al. |
| 4,345,206 A | 8/1982 | Skalka |
| 4,368,354 A | 1/1983 | Furihata et al. |
| 4,374,358 A | 2/1983 | Hirose |
| 4,389,642 A | 6/1983 | Kahn |
| 4,420,809 A | 12/1983 | Pierce |
| 4,494,067 A | 1/1985 | Barszczewski |
| 4,514,592 A | 4/1985 | Miyaguchi |
| 4,544,892 A | 10/1985 | Kaufman et al. |
| 4,546,490 A | 10/1985 | Miller-Thomson et al. |
| 4,583,211 A | 4/1986 | Nishikawa et al. |
| 4,588,979 A | 5/1986 | Adams |
| 4,603,292 A | 7/1986 | Russell |
| 4,609,990 A | 9/1986 | Sember et al. |
| 4,616,173 A | 10/1986 | Cook et al. |
| 4,651,089 A | 3/1987 | Haigh |
| 4,667,689 A | 5/1987 | Kohashi |
| 4,670,712 A | 6/1987 | Lavergnat et al. |
| 4,672,556 A | 6/1987 | Shepler |
| 4,695,791 A | 9/1987 | Miller |
| 4,695,792 A | 9/1987 | Roy |
| 4,707,653 A | 11/1987 | Wagner |
| 4,716,363 A | 12/1987 | Dukes et al. |
| 4,760,536 A | 7/1988 | Curtis |
| 4,769,836 A | 9/1988 | Aihara |
| 4,795,963 A | 1/1989 | Ueno et al. |
| 4,864,588 A | 9/1989 | Simpson et al. |
| 4,864,634 A | 9/1989 | Nakagawa et al. |
| 4,866,260 A | 9/1989 | Lescourret |
| 4,880,005 A | 11/1989 | Pless et al. |
| 4,942,365 A | 7/1990 | Satterwhite |
| 4,984,254 A | 1/1991 | Thomas |
| 5,027,228 A | 6/1991 | Yokoyama |
| 5,065,095 A | 11/1991 | Suzuki |
| 5,095,279 A | 3/1992 | Quan et al. |
| 5,122,758 A | 6/1992 | Tomita |
| 5,128,607 A | 7/1992 | Clark et al. |
| 5,157,699 A | 10/1992 | Miyazaki et al. |
| 5,168,215 A | 12/1992 | Puzzo |
| 5,206,549 A | 4/1993 | Suzuki et al. |
| 5,262,714 A | 11/1993 | Friedman |
| 5,302,916 A | 4/1994 | Pritchett |
| 5,304,938 A | 4/1994 | Gregory et al. |
| 5,313,154 A | 5/1994 | Norris |
| 5,317,215 A | 5/1994 | Kranzler |
| 5,323,096 A | 6/1994 | Nakai |
| 5,365,181 A | 11/1994 | Mair |
| 5,381,085 A | 1/1995 | Fischer |
| 5,442,278 A | 8/1995 | Fan Chiang et al. |
| 5,448,606 A | 9/1995 | Snelgrove |
| 5,471,133 A | 11/1995 | Sezi |
| 5,509,040 A | 4/1996 | Shimada |
| 5,539,355 A | 7/1996 | Nakamura |
| 5,555,247 A | 9/1996 | Matsuoka et al. |
| 5,650,954 A | 7/1997 | Minuhin |
| 5,652,552 A | 7/1997 | Chung |
| 5,710,710 A | 1/1998 | Owen et al. |
| 5,764,045 A | 6/1998 | Hayashi |
| 5,941,974 A | 8/1999 | Babin |
| 6,018,560 A | 1/2000 | Kim |
| 6,078,200 A | 6/2000 | Miyano |
| 6,127,950 A | 10/2000 | Yamauchi |
| 6,140,869 A | 10/2000 | Troise |
| 6,161,420 A * | 12/2000 | Dilger et al. .................. 73/24.01 |
| 6,172,533 B1 | 1/2001 | Fransson et al. |
| 6,172,579 B1 | 1/2001 | Dacus et al. |
| 6,181,829 B1 | 1/2001 | Clark et al. |
| 6,259,251 B1 | 7/2001 | Sugiura et al. |
| 6,265,869 B1 | 7/2001 | Takahashi |
| 6,282,803 B1 | 9/2001 | Dunne |
| 6,359,938 B1 | 3/2002 | Keevill et al. |
| 6,360,090 B1 | 3/2002 | Holcombe et al. |
| 6,377,616 B1 | 4/2002 | Brankovic et al. |
| 6,411,075 B1 | 6/2002 | Battiston et al. |
| 6,463,452 B1 | 10/2002 | Schulist |
| 6,519,194 B2 | 2/2003 | Tsujino et al. |
| 6,549,479 B2 | 4/2003 | Blodgett |
| 6,566,964 B1 | 5/2003 | Hirano |
| 6,590,400 B2 | 7/2003 | Hilliard et al. |
| 6,665,367 B1 | 12/2003 | Blair |
| 6,674,277 B1 | 1/2004 | Oishi et al. |
| 6,675,326 B1 | 1/2004 | Yoshizaki |
| 6,680,607 B2 | 1/2004 | Smith |
| 6,759,838 B2 | 7/2004 | Tao et al. |
| 6,834,093 B1 | 12/2004 | Chiu |
| 6,859,026 B2 * | 2/2005 | Hsi et al. .................. 324/76.52 |
| 6,888,902 B1 | 5/2005 | Kondo |
| 6,917,191 B2 | 7/2005 | Oishi et al. |
| 7,027,940 B2 | 4/2006 | Iannuzzi |
| 7,046,964 B1 | 5/2006 | Sullivan et al. |
| 7,068,744 B2 | 6/2006 | Watanabe |
| 7,124,153 B2 | 10/2006 | Grushin |
| 7,230,458 B2 | 6/2007 | DaDalt |
| 7,242,223 B1 | 7/2007 | Alon |
| 7,265,559 B1 | 9/2007 | Hladky et al. |
| 7,266,756 B2 | 9/2007 | Saado et al. |
| 7,271,631 B2 | 9/2007 | Watanabe |
| 7,276,978 B2 | 10/2007 | Puma et al. |
| 7,285,961 B2 | 10/2007 | Shinmoto et al. |
| 7,372,875 B2 | 5/2008 | Hadzic et al. |
| 7,394,723 B2 | 7/2008 | Rubin |
| 7,409,031 B1 * | 8/2008 | Lee et al. .................. 375/376 |
| 7,429,896 B2 | 9/2008 | Hattori |
| 7,436,265 B2 | 10/2008 | Park et al. |
| 7,463,096 B2 | 12/2008 | Chi et al. |
| 7,466,789 B2 | 12/2008 | Rieubon et al. |
| 7,504,976 B1 | 3/2009 | Pellon |
| 7,560,962 B2 | 7/2009 | Kamath |
| 7,636,747 B2 | 12/2009 | Watanabe |

(56) References Cited

U.S. PATENT DOCUMENTS

| | | |
|---|---|---|
| 7,642,767 B2 | 1/2010 | Willis |
| 7,653,170 B2 | 1/2010 | Mattes et al. |
| 7,692,419 B1 | 4/2010 | Peel |
| 7,696,741 B2 | 4/2010 | Gurr |
| 7,729,071 B2 | 6/2010 | Harada |
| 7,737,688 B2 | 6/2010 | Tomida et al. |
| 7,750,618 B1 | 7/2010 | Fang et al. |
| 7,750,685 B1 | 7/2010 | Bunch |
| 7,804,289 B2 | 9/2010 | Li |
| 7,847,597 B1 | 12/2010 | Chan et al. |
| 7,907,016 B2 | 3/2011 | Eikenbroek |
| 7,932,751 B2 | 4/2011 | Boomer |
| 8,139,685 B2 | 3/2012 | Simic et al. |
| 8,140,283 B2 | 3/2012 | Benmouyal et al. |
| 8,242,941 B2 | 8/2012 | Arknaes-Pedersen et al. |
| 8,258,831 B1 | 9/2012 | Banai et al. |
| 8,461,821 B2 | 6/2013 | Todorokihara |
| 8,508,213 B2 | 8/2013 | Todorokihara |
| 2001/0045868 A1 | 11/2001 | Takeyabu et al. |
| 2001/0048348 A1 | 12/2001 | Unterricker |
| 2002/0000800 A1 | 1/2002 | Hill |
| 2002/0024343 A1 | 2/2002 | Moore |
| 2002/0097091 A1 | 7/2002 | Takagishi |
| 2002/0167874 A1 | 11/2002 | Hayashi |
| 2002/0180415 A1 | 12/2002 | Roth |
| 2003/0038624 A1 | 2/2003 | Hilliard et al. |
| 2003/0046064 A1 | 3/2003 | Moriya et al. |
| 2003/0062959 A1 | 4/2003 | Tsuda et al. |
| 2003/0165112 A1 | 9/2003 | Noda |
| 2003/0176932 A1 | 9/2003 | Wild |
| 2003/0184346 A1 | 10/2003 | Lamb |
| 2003/0215100 A1 | 11/2003 | Kimura et al. |
| 2004/0075425 A1 | 4/2004 | Horio et al. |
| 2004/0078737 A1 | 4/2004 | Miyamoto |
| 2004/0196052 A1 | 10/2004 | Okayasu |
| 2004/0199345 A1 | 10/2004 | Ananthanarayanan et al. |
| 2005/0025270 A1 | 2/2005 | Muhammad et al. |
| 2005/0110500 A1 | 5/2005 | Hoyte et al. |
| 2005/0147197 A1 | 7/2005 | Perrott |
| 2005/0237125 A1 | 10/2005 | Hino |
| 2005/0270043 A1 | 12/2005 | Iacob et al. |
| 2006/0084386 A1 | 4/2006 | Irie et al. |
| 2006/0120537 A1 | 6/2006 | Burnett et al. |
| 2006/0171496 A1 | 8/2006 | Nakamuta et al. |
| 2006/0246865 A1 | 11/2006 | Makarov |
| 2006/0267698 A1 | 11/2006 | Erdogan et al. |
| 2006/0285756 A1 | 12/2006 | Sugita |
| 2007/0094581 A1 | 4/2007 | Kajita |
| 2007/0103333 A1 | 5/2007 | Michalski et al. |
| 2007/0132442 A1 | 6/2007 | Jones |
| 2007/0159938 A1 | 7/2007 | Sugawara et al. |
| 2007/0216556 A1 | 9/2007 | Rieubon et al. |
| 2008/0019471 A1 | 1/2008 | Waldner |
| 2008/0068096 A1 | 3/2008 | Feng et al. |
| 2008/0104072 A1 | 5/2008 | Stampleman et al. |
| 2008/0120356 A1 | 5/2008 | Watanabe |
| 2008/0122498 A1 | 5/2008 | Furukawa |
| 2008/0136400 A1 | 6/2008 | Chi et al. |
| 2008/0136471 A1 | 6/2008 | Kamath |
| 2008/0165862 A1 | 7/2008 | Takahashi |
| 2008/0189064 A1 | 8/2008 | Yamaguchi et al. |
| 2008/0191762 A1 | 8/2008 | Seethamraju et al. |
| 2008/0204088 A1 | 8/2008 | Garlapati et al. |
| 2008/0229829 A1 | 9/2008 | Kondo |
| 2008/0247500 A1 | 10/2008 | Goto et al. |
| 2008/0256157 A1 | 10/2008 | Bostaman et al. |
| 2008/0291287 A1 | 11/2008 | Dvir |
| 2008/0320065 A1 | 12/2008 | Kan |
| 2009/0058452 A1 | 3/2009 | Tanaka et al. |
| 2009/0058468 A1 | 3/2009 | Hjelm et al. |
| 2009/0144018 A1 | 6/2009 | Chang et al. |
| 2009/0153256 A1 | 6/2009 | Jo et al. |
| 2009/0156150 A1 | 6/2009 | Deleon |
| 2009/0180527 A1 | 7/2009 | Asami |
| 2009/0192958 A1 | 7/2009 | Todorokihara |
| 2009/0237070 A1 | 9/2009 | Herselman |
| 2009/0240994 A1 | 9/2009 | Lee |
| 2009/0243736 A1 | 10/2009 | Miura et al. |
| 2009/0251129 A1 | 10/2009 | Todorokihara et al. |
| 2009/0261809 A1 | 10/2009 | Li |
| 2009/0295460 A1 | 12/2009 | Gulba et al. |
| 2009/0296878 A1 | 12/2009 | Tsai |
| 2010/0052653 A1 | 3/2010 | Lebrun |
| 2010/0054390 A1 | 3/2010 | Kim et al. |
| 2010/0091752 A1 | 4/2010 | Kemmochi et al. |
| 2010/0213924 A1 | 8/2010 | Osumi et al. |
| 2010/0289479 A1 | 11/2010 | Prance et al. |
| 2010/0295535 A1 | 11/2010 | Todorokihara |
| 2010/0295536 A1 | 11/2010 | Todorokihara |
| 2010/0295537 A1 | 11/2010 | Todorokihara |
| 2010/0315061 A1 | 12/2010 | Tomita et al. |
| 2011/0050352 A1* | 3/2011 | Kondo et al. ............... 331/46 |
| 2011/0068828 A1 | 3/2011 | Anderson et al. |
| 2011/0074514 A1 | 3/2011 | Marutani |
| 2011/0082656 A1 | 4/2011 | Todorokihara |
| 2011/0084687 A1 | 4/2011 | Todorokihara |
| 2011/0150168 A1 | 6/2011 | Tseng et al. |
| 2011/0182398 A1 | 7/2011 | Iwashita et al. |
| 2011/0235772 A1 | 9/2011 | Obkircher |
| 2012/0019301 A1 | 1/2012 | Murray |
| 2012/0053903 A1 | 3/2012 | Todorokihara |
| 2012/0161815 A1 | 6/2012 | Polivka |

FOREIGN PATENT DOCUMENTS

| | | |
|---|---|---|
| JP | 53-111768 | 9/1978 |
| JP | A-56-169923 | 12/1981 |
| JP | A-61-501528 | 7/1986 |
| JP | A-61-223662 | 10/1986 |
| JP | A-62-298726 | 12/1987 |
| JP | A-64-007706 | 1/1989 |
| JP | A-64-054271 | 3/1989 |
| JP | A-64-57189 | 3/1989 |
| JP | A-01-182758 | 7/1989 |
| JP | A-01-269297 | 10/1989 |
| JP | A-02-207693 | 8/1990 |
| JP | A-02-252306 | 10/1990 |
| JP | A-02-281154 | 11/1990 |
| JP | A-04-048271 | 2/1992 |
| JP | A-04-072815 | 3/1992 |
| JP | A-04-357468 | 12/1992 |
| JP | A-05-030772 | 4/1993 |
| JP | A-05-172861 | 7/1993 |
| JP | A-05-327515 | 12/1993 |
| JP | A-06-011525 | 1/1994 |
| JP | A-06-501554 | 2/1994 |
| JP | A-06-164372 | 6/1994 |
| JP | A-06-235743 | 8/1994 |
| JP | A-06-342021 | 12/1994 |
| JP | A-07-055554 | 3/1995 |
| JP | A-07-229910 | 8/1995 |
| JP | A-07-260526 | 10/1995 |
| JP | A-09-178785 | 7/1997 |
| JP | A-09-304259 | 11/1997 |
| JP | A-10-132874 | 5/1998 |
| JP | A-10-170566 | 6/1998 |
| JP | A-11-154921 | 6/1999 |
| JP | A-11-220369 | 8/1999 |
| JP | A-11-264846 | 9/1999 |
| JP | A-2000-505547 | 5/2000 |
| JP | A-2000-307384 | 11/2000 |
| JP | A-2001-502050 | 2/2001 |
| JP | A-2001-094395 | 4/2001 |
| JP | A-2001-119291 | 4/2001 |
| JP | A-2001-166008 | 6/2001 |
| JP | A-2001-177378 | 6/2001 |
| JP | A-2002-057583 | 2/2002 |
| JP | A-2003-065768 | 3/2003 |
| JP | A-2003-179490 | 6/2003 |
| JP | A-2003-194860 | 7/2003 |
| JP | A-2003-249905 | 9/2003 |
| JP | A-2003-307481 | 10/2003 |
| JP | A-2003-315356 | 11/2003 |
| JP | A-2005-020554 | 1/2005 |

(56) References Cited

FOREIGN PATENT DOCUMENTS

| JP | A-2006-029874 | 2/2006 |
|---|---|---|
| JP | A-2006-165912 | 6/2006 |
| JP | A-2007-060447 | 3/2007 |
| JP | A-2008-131500 | 6/2008 |
| JP | A-2008-147837 | 6/2008 |
| JP | A-2009-229353 | 10/2009 |
| JP | A-2009-250807 | 10/2009 |
| JP | A-2009-250808 | 10/2009 |
| JP | A-2010-085286 | 4/2010 |
| JP | A-2010-127914 | 6/2010 |
| JP | A-2010-271210 | 12/2010 |
| JP | A-2010-271211 | 12/2010 |
| WO | WO 85-04487 A | 10/1985 |
| WO | WO 92/04634 A1 | 3/1992 |

OTHER PUBLICATIONS

Feb. 29, 2012 Office Action issued in U.S. Appl. No. 12/782,382.
Mar. 7, 2012 Office Action issued in U.S. Appl. No. 12/418,000.
Jul. 23, 2012 Office Action issued in U.S. Appl. No. 12/835,108.
Jul. 31, 2012 Office Action issued in U.S. Appl. No. 12/418,000.
Sep. 14, 2012 Office Action issued in U.S. Appl. No. 12/784,136.
Sep. 19, 2012 Office Action dated issued in U.S. Appl. No. 12/782,382.
Sep. 27, 2012 Office Action Issued in U.S. Appl. No. 12/783,900.
Oct. 17, 2012 Office Action issued in U.S. Appl. No. 12/889,770.
U.S. Appl. No. 12/783,900 in the name of Todorokihara, filed on May 20, 2010.
U.S. Appl. No. 12/835,108 in the name of Kondo filed on Jul. 13, 2010.
U.S. Appl. No. 12/889,770 in the name of Todorokihara, filed Sep. 24, 2010.
U.S. Appl. No. 12/784,136 in the name of Todorokihara, filed May 20, 2010.
U.S. Appl. No. 12/782,382 in the name of Todorokihara, filed May 18, 2010.
U.S. Appl. No. 12/418,000 in the name of Todorokihara, filed Apr. 3, 2009.
U.S. Appl. No. 12/896,106 in the name of Todorokihara, filed Oct. 1, 2010.
Nov. 13, 2012 Office Action issued in U.S. Appl. No. 12/896,106.
Nov. 28, 2012 Office Action issued in U.S. Appl. No. 12/418,000.
Nov. 30, 2012 Notice of Allowance issued in U.S. Appl. No. 12/782,382.
Office Action issued Dec. 14, 2011 in U.S. Appl. No. 12/782,382.
Office Action issued Dec. 29, 2011 in U.S. Appl. No. 12/783,900.
Office Action issued Dec. 29, 2011 in U.S. Appl. No. 12/835,108.
Office Action issued Jan. 6, 2012 in U.S. Appl. No. 12/784,136.
Katano, K., "Introduction to Proper Method for Using Measuring Instruments; How to Use Timing Devices," Transistor Technology Seminar, 14$^{th}$ Installment, Feb. 1994, p. 331-338 (with English translation).
Oct. 11, 2011 Office Action issued in U.S. Appl. No. 12/418,000.
Feb. 6, 2013 Notice of Allowance issued in U.S. Appl. No. 12/784,136.
Jan. 14, 2013 Advisory Action issued in U.S. Appl. No. 12/783,900.
Jan. 28, 2013 Office Action issued in U.S. Appl. No. 12/783,900.
Jan. 31, 2013 Office Action issued in U.S. Appl. No. 12/889,770.
Mar. 13, 2013 Notice of Allowance issued in U.S. Appl. No. 12/782,382.
Apr. 8, 2013 Office Action issued in U.S. Appl. No. 12/835,108.
Apr. 19, 2013 Notice of Allowance issued in U.S. Appl. No. 12/889,770.
Office Action dated May 25, 2012 issued in U.S. Appl. No. 12/782,382.
Office Action dated May 30, 3012 issued in U.S. Appl. No. 12/783,900.
Office Action dated May 23, 2012 issued in U.S. Appl. No. 12/784,136.
Office Action dated Jun. 5, 2012 issued in U.S. Appl. No. 12/418,000.
Nov. 22, 2013 Notice of Allowance issued in U.S. Appl. No. 12/896,106.
Jun. 12, 2013 Notice of Allowance issued in U.S. Appl. No. 12/783,900.
Jul. 8, 2013 Office Action issued in U.S. Appl. No. 12/896,106.
Jul. 16, 2013 Notice of Allowance issued in U.S. Appl. No. 12/889,770.
Jul. 11, 2013 Corrected Notice of Allowability issued in U.S. Appl. No. 12/782,382.
May 9, 2013 Supplemental Notice of Allowability issue in U.S. Appl. No. 12/889,770.
Sep. 10, 2013 Notice of Allowance issued in U.S. Appl. No. 12/835,108.

* cited by examiner

FREQUENCY MEASUREMENT DEVICE AND ELECTRONIC DEVICE

The entire disclosure of Japanese Patent Application No. 2010-194728, filed Aug. 31, 2010 is expressly incorporated by reference herein.

BACKGROUND

1. Technical Field

The present invention relates to measurement of frequencies, and more particularly, to a frequency measurement device capable of detecting a very small change in frequency.

2. Related Art

Frequency measurement methods are known such as a direct count method (for example, see JP-A-2001-119291) wherein the number of pulses passing within a prescribed gate period (gate time) is measured, a reciprocal method (for example, see JP-A-5-172861) wherein an accurate pulse period is measured and a frequency is calculated from the reciprocal of time, and a method (for example, see U.S. Pat. No. 7,230,458) wherein frequencies are calculated by obtaining a $\Delta\Sigma$ modulation signal. Although the direct count method can be realized with a relatively small-scale circuit, it is necessary to increase the gate time in order to increase frequency resolution (for example, the gate time needed for obtaining a resolution of 0.1 Hz is 10 seconds). Although the reciprocal method can solve this problem, the circuit for measuring pulse intervals accurately becomes larger in scale as compared to that of the direct count method. The method wherein frequencies are calculated by obtaining a $\Delta\Sigma$ modulation signal has a limitation in obtaining a dynamic range and has to trade off dynamic range against measurement accuracy. Although the measurement accuracy can be improved by obtaining a high-order $\Delta\Sigma$ modulation signal or using a PLL, there is a problem in that an additional analog circuit is needed, thus increasing the circuit size.

The present applicant has proposed a frequency measurement device based on a short gate time count method (also referred to as a short gate count method or a short gate method) as a new method substituting the above-described methods (for example, see JP-A-2009-250807). The short gate count method is configured to perform counting (sampling) of a measurement signal repeatedly without being interrupted at a prescribed short gate time to remove (filter out) high-frequency components from a series of obtained count values. In this way, the short gate count method improves both time resolution and frequency resolution as compared to the method of the related art. Since a frequency measurement device using this method is configured by a counter circuit and a small-scale computation circuit, it is possible to easily realize a multi-channel implementation while suppressing an increase in the circuit size. Moreover, as the gate time decreases, namely as the sampling frequency increases, it is possible to improve both dynamic range and resolution.

However, when the short gate count method is used, pattern noise occurs under certain conditions. The pattern noise increases as an operating point parameter which is obtained by the ratio of a measurement frequency (the frequency of a measurement signal) to a sampling frequency (the frequency of a gate signal) approaches a simple advantageous value. Therefore, the present applicant has proposed a method of decreasing the level of pattern noise by selecting a measurement frequency and a sampling frequency based on the distribution characteristics of an operating point parameter and a noise level (see JP-A-2010-085286).

However, in the method of the related art, it is difficult to reduce the level of pattern noise when the amount of change in the measurement frequency is large.

SUMMARY

An advantage of some aspects of the invention is that it provides a frequency measurement device capable of eliminating the effect of pattern noise even when a measurement frequency changes greatly.

An aspect of the invention is directed to a frequency measurement device capable of measuring the frequency of a measurement signal continuously even when a frequency division or multiplication ratio is changed dynamically, including: a reference signal source generating a reference signal; a frequency divider/multiplier section generating a frequency division/multiplication reference signal obtained by dividing or multiplying the reference signal by the frequency division or multiplication ratio; a first counter section outputting a first count value obtained by measuring the rising and/or falling edge of the measurement signal, observed within a prescribed period, determined based on the frequency division/multiplication reference signal; a first low-pass filter removing a high-frequency component included in the first count value; a coefficient deriving section deriving a conversion coefficient based on the frequency division or multiplication ratio; and a conversion section multiplying an output value of the first low-pass filter by the conversion coefficient or the reciprocal of the conversion coefficient.

According to the frequency measurement device having the configuration, since it includes the coefficient deriving section and the conversion section, it is possible to appropriately correct the transient response of the output signal which can occur when the frequency division or multiplication ratio of the reference signal is dynamically changed. Thus, it is possible to measure the frequency of the measurement signal continuously.

Moreover, the frequency measurement device is configured to select the combination of the frequency of the frequency division/multiplication reference signal and the frequency of the measurement signal so that pattern noise is prevented from increasing. Therefore, it is possible to suppress the effect of the pattern noise on the output signal.

The coefficient deriving section may include a second counter section outputting a second count value obtained by measuring the rising and/or falling edge of the reference signal included in a prescribed period determined based on the frequency division/multiplication reference signal, and a second low-pass filter outputting the second count value as the conversion coefficient by removing a high-frequency component included in the second count value. The conversion section may multiply the output value of the first low-pass filter by the reciprocal of the conversion coefficient.

According to this configuration, it is possible to configure the coefficient deriving section and the conversion section with a relatively simple circuit.

The frequency divider/multiplier section may change the frequency division or multiplication ratio dynamically so that the value of an operating point parameter defined by the fractional portion of the ratio x/y of the frequency x of the measurement signal to the frequency y of the frequency division/multiplication reference signal falls within a prescribed range.

According to the configuration, the frequency division or multiplication ratio can be dynamically changed so as to obtain an operating point parameter so that the pattern noise is prevented from increasing. Accordingly, it is possible to effectively decrease the pattern noise included in the output signal.

Another aspect of the invention is directed to a frequency measurement device capable of measuring the frequency of a measurement signal continuously even when a frequency division or multiplication ratio is changed dynamically, including: a reference signal source generating a reference signal; a first frequency divider/multiplier section generating a frequency division/multiplication measurement signal obtained by dividing or multiplying the measurement signal by a first frequency division or multiplication ratio; a first counter section outputting a first count value obtained by measuring the rising and/or falling edge of the frequency division/multiplication measurement signal included in a prescribed period determined based on the reference signal; a first low-pass filter removing a high-frequency component included in the first count value; a coefficient deriving section deriving a conversion coefficient based on the first frequency division or multiplication ratio; and a conversion section multiplying an output value of the first low-pass filter by the conversion coefficient or the reciprocal of the conversion coefficient.

According to the frequency measurement device having the configuration, since it includes the coefficient deriving section and the conversion section, it is possible to appropriately correct the transient response of the output signal which can occur when the frequency division or multiplication ratio of the measurement signal is changed dynamically. Thus, it is possible to measure the frequency of the measurement signal continuously.

Moreover, the frequency measurement device is configured to select the combination of the frequency of the frequency division/multiplication measurement signal and the frequency of the reference, signal so that pattern noise is prevented from increasing. Therefore, it is possible to suppress the effect of the pattern noise on the output signal.

The coefficient deriving section may include a second frequency divider/multiplier section generating a frequency division/multiplication reference signal obtained by dividing or multiplying the reference signal by a second frequency division or multiplication ratio, a second counter section outputting a second count value obtained by measuring the rising and/or falling edge of the reference signal included in a prescribed period determined based on the frequency division/multiplication reference signal, and a second low-pass filter outputting the second count value as the conversion coefficient by removing a high-frequency component included in the second count value. The conversion section may multiply the output value of the first low-pass filter by the reciprocal of the conversion coefficient.

According to this configuration, it is possible to configure the coefficient deriving section and the scaling section with a relatively simple circuit.

The first and second frequency divider/multiplier sections may change the first and second frequency division or multiplication ratios dynamically so that the value of an operating point parameter defined by the fractional portion of the ratio x/y of the frequency x of the frequency division/multiplication measurement signal to the frequency y of the reference signal falls within a prescribed range.

According to the configuration, the first and second frequency division or multiplication ratios can be dynamically changed so as to obtain an operating point parameter so that the pattern noise is prevented from increasing. Accordingly, it is possible to effectively decrease the pattern noise included in the output signal.

Still another aspect of the invention is directed to an electronic device including the frequency measurement device of the above aspect.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
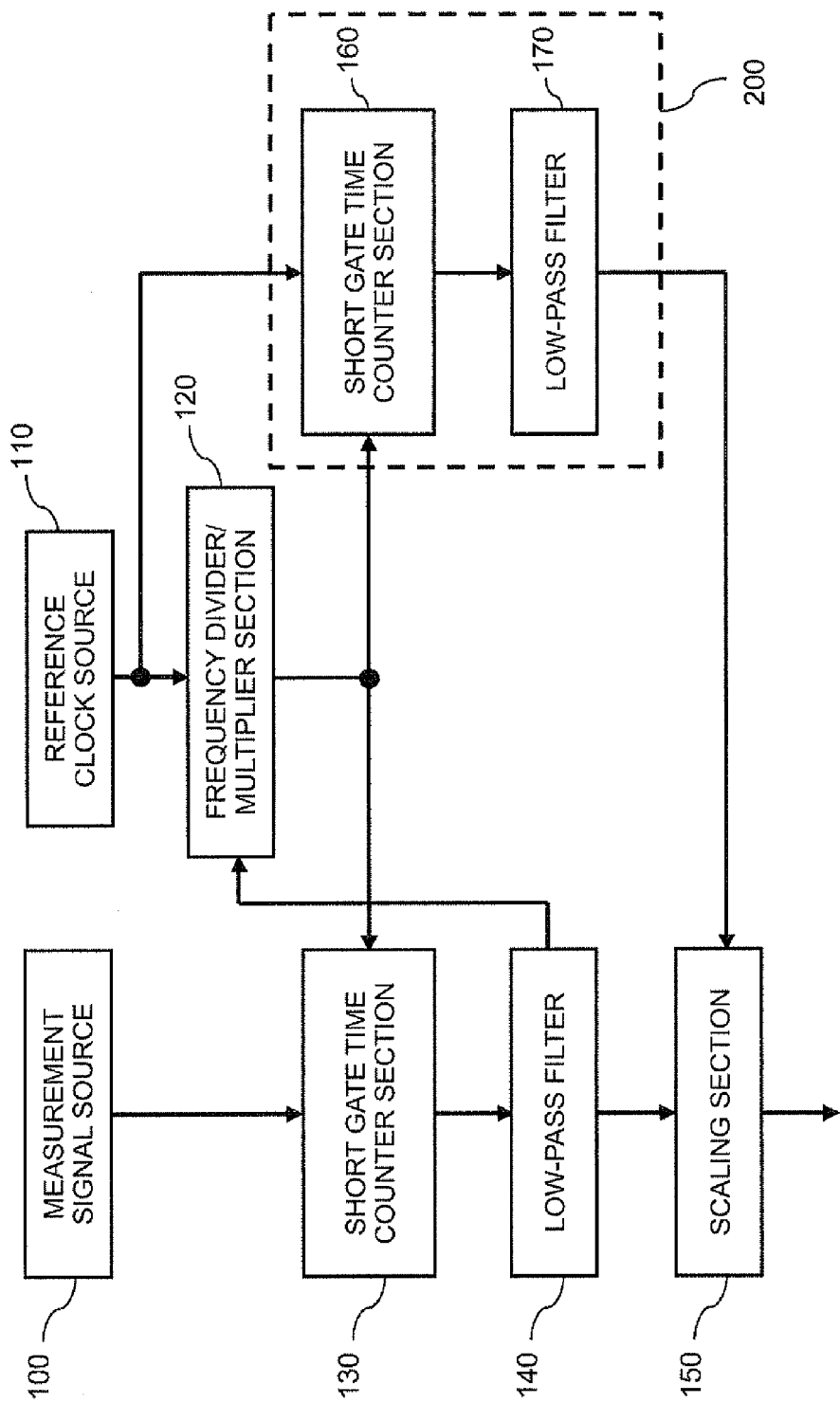
FIG. 1 is a diagram showing the configuration of a frequency measurement device according to a first embodiment.

Embodiments of the invention will be described in detail with reference to the drawings in the following order. It should be understood, however, that the following embodiments are merely examples of the invention, and do not limit the technical range of the invention. In the respective drawings, the same components will be denoted by the same reference numerals, and description thereof may be omitted.

1. Definition
2. First Embodiment
(1) Configuration of Frequency Measurement Device
(2) Configuration of Frequency Measurement Device of Comparative Example
(3) Operation of Frequency Measurement Device
3. Second Embodiment
4. Supplement 1. Definition First, the terminology used in this specification is defined as follows.

An "XX section" (XX may be any words) includes a section which is configured by an electrical circuit and a semiconductor circuit, and without being limited to this, may include a physical means that performs the function of that section, a functional means that is realized by software, and the like. Moreover, the function of one section may be realized by two or more physical or functional means, or the functions of two or more sections may be realized by one physical or functional means.

"Scaling" means converting a certain value into a desired unit by performing a prescribed arithmetic computation on the value. For example, a scaling section (conversion section)

according to the invention can output a value indicating a frequency by performing a prescribed arithmetic computation on an input value.

2. First Embodiment

Hereinafter, a first embodiment of the invention will be described with reference to FIGS. 1 to 8.

(1) Configuration of Frequency Measurement Device

FIG. 1 is a diagram showing the configuration of a frequency measurement device according to the first embodiment. As shown in FIG. 1, the frequency measurement device is configured to include a measurement signal source 100, a reference clock source 110, a frequency divider/multiplier section 120, a short gate time counter section 130, a low-pass filter 140, a scaling section 150, and a coefficient deriving section 200. The coefficient deriving section 200 includes a short gate time counter section 160 and a low-pass filter 170.

Measurement Signal Source 100

The measurement signal source 100 is configured to generate a measurement pulse train signal. For example, the measurement signal source 100 is a crystal oscillator having an oscillation frequency of about 30 MHz and is configured to include a crystal vibrator and an oscillation circuit. An adsorption film having a property of adsorbing a prescribed substance is formed on the surface of the crystal vibrator. When an odor substance or the like adheres to the adsorption film, the oscillation frequency of the crystal oscillator decreases in accordance with the amount of substance adhering. The frequency measurement device of the first embodiment can detect the amount of substance adhering to the adsorption film by observing the decrease in the oscillation frequency thereof and thus can be applied to an odor sensor or the like. The measurement signal is input to the short gate time counter section 130.

Reference Clock Source 110

The reference clock source (reference signal source) 110 is configured to be capable of generating a reference clock (reference signal) which is a pulse train signal having a fixed frequency different from the measurement signal. The reference clock source 110 is a crystal oscillator configured independently from the measurement signal source 100 and is configured to include a crystal vibrator and an oscillation circuit. No adsorption film is formed on the surface of the crystal vibrator unlike the measurement signal source 100, and the reference clock becomes a signal having a constant frequency regardless of a substance included in a gas surrounding the crystal vibrator.

Frequency Divider/Multiplier Section 120

The frequency divider/multiplier section 120 is configured to be capable of generating a frequency division/multiplication reference clock (frequency division/multiplication reference signal) which is obtained by dividing and/or multiplying the reference clock by a variable frequency division or multiplication ratio. The frequency division or multiplication ratio is determined based on a count value fed back from the low-pass filter 140. The frequency divider/multiplier section 120 may have only a frequency division function which can be configured by a simple counter or the like.

Short Gate Time Counter Section 130

The short gate time counter section 130 measures at least one of a rising edge and a falling edge of the measurement signal measured during a gate period corresponding to one cycle of the frequency division/multiplication reference clock while measuring (counting) the pulse train of the input measurement signal without interruption. The count value which is the counting result is output to the low-pass filter 140. The short gate time counter section 130 can be configured to continuously measure the edge of the measurement signal using an internal counter without being reset and sample the continuous count value thereof using the edge of the frequency division/multiplication reference clock to thereby obtain a continuous count value. Here, the number of edges of the measurement signal observed between the edges of the frequency division/multiplication reference clock can be derived from a difference between the currently obtained continuous count value and the previously obtained continuous count value. The frequency of the frequency division/multiplication reference clock is sometimes referred to as a "sampling frequency," and one cycle of the frequency division/multiplication reference clock is sometimes referred to as a "sampling cycle."

Low-Pass Filter 140

The low-pass filter 140 is configured to remove a high-frequency component included in the input count value to output only a low-frequency component as an output signal. In addition, the low-pass filter 140 outputs the count value input from the short gate time counter section 130 to the frequency divider/multiplier section 120. A specific example of the configuration of the low-pass filter 140 includes a moving average filter.

Scaling Section 150

The scaling section (conversion section) 150 is configured to be capable of outputting the output value of the low-pass filter 140 by multiplying it by a scaling coefficient (conversion coefficient) derived by the coefficient deriving section 200 or the reciprocal thereof. In this way, the scaling section 150 can output a value corresponding to the frequency of the measurement signal, for example.

Coefficient Deriving Section 200

The coefficient deriving section 200 is configured to be capable of deriving the scaling coefficient based on the frequency division or multiplication ratio. Here, the scaling coefficient is used in order to measure the frequency of the measurement signal continuously without being affected by a transient response even when the frequency division or multiplication ratio is dynamically changed during the operation of the frequency measurement device. Moreover, as described above, the coefficient deriving section 200 is configured to include the short gate time counter section 160 and the low-pass filter 170.

Short Gate Time Counter Section 160

The short gate time counter section 160 is configured to be capable of measuring (counting) the pulse train of the input reference clock without being interrupted at the gate period corresponding to one cycle of the frequency division/multiplication reference clock and outputting the count value thereof. This configuration is the same as the configuration of the short gate time counter section 130 except that one of the input signals is changed from the measurement signal to the reference clock.

Low-Pass Filter 170

The low-pass filter 170 is configured to remove a high-frequency component included in the count value input from the short gate time counter section 160 and output only a low-frequency component thereof as an output signal. This configuration is the same as the configuration of the low-pass filter 140 except that the output of the short gate time counter section 130 is changed to the output of the short gate time counter section 160. A specific example of the configuration of the low-pass filter 170 includes a moving average filter.

(2) Configuration of Frequency Measurement Device of Comparative Example

Here, for better understanding of the characteristics of the frequency measurement device of the first embodiment, a comparative example of the frequency measurement device will be described with reference to FIG. 2.

Figure 2:
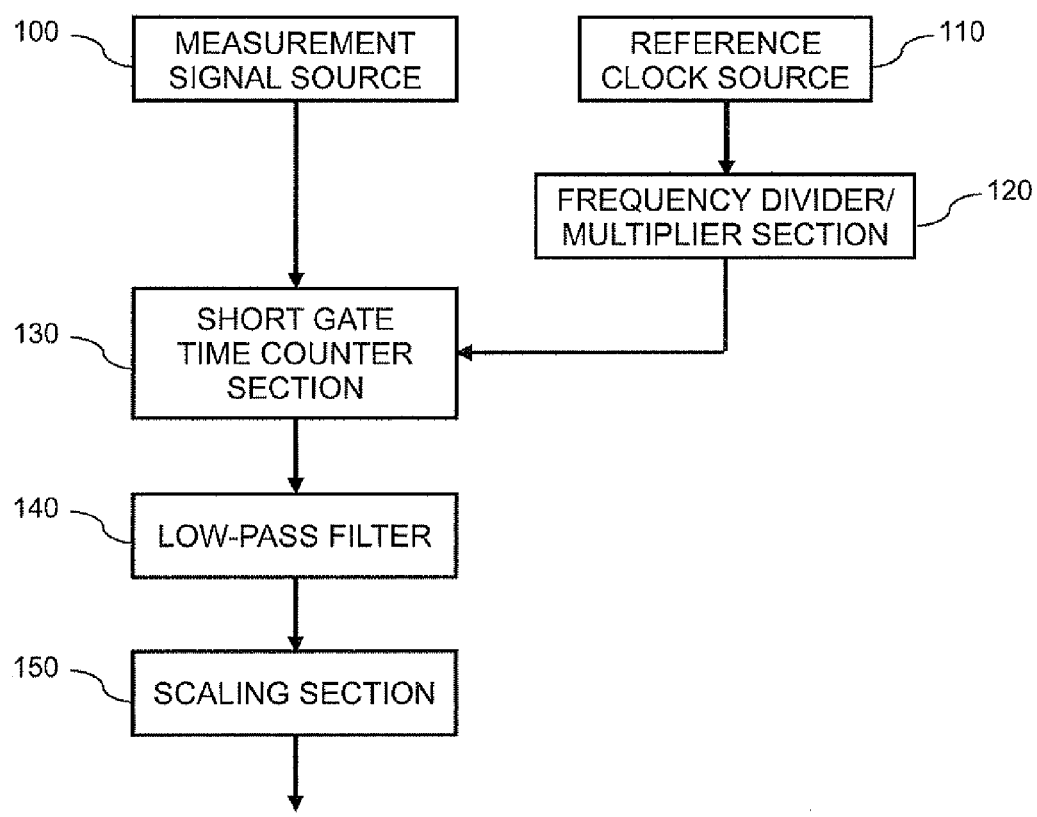
FIG. 2 is a diagram showing the configuration of a frequency measurement device according to a comparative example.

The frequency measurement device of the comparative example does not include the coefficient deriving section 200 as can be understood from the difference between FIGS. 1 and 2. Therefore, the scaling section 150 performs processing using a fixed scaling coefficient regardless of a change in the frequency division or multiplication ratio.

(3) Operation of Frequency Measurement Device

Next, the operation of the frequency measurement device of the first embodiment will be described in detail with reference to FIGS. 3 to 8. In this example, for better understanding of the characteristics of the frequency measurement device of the first embodiment, the operation of the frequency measurement device of the comparative example will be also described.

Figure 3:
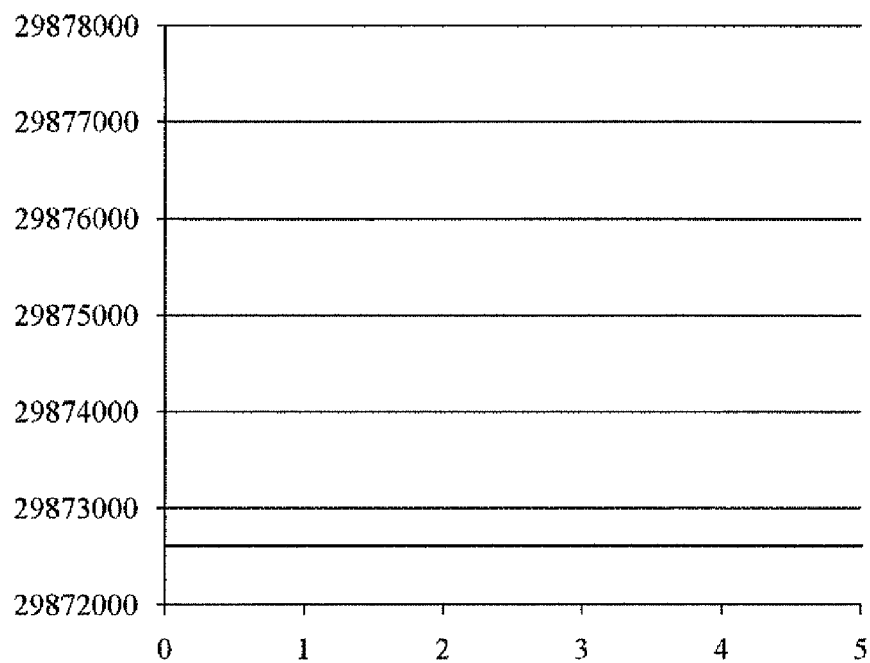
FIG. 3 is a first graph showing the output value of the frequency measurement device according to the comparative example.

FIG. 3 shows the output value of the frequency measurement device of the comparative example when a signal having a frequency of 30010024.5 Hz is used as the reference clock, the frequency divider/multiplier section 120 divides the reference clock by 32768, and the rising edge of the measurement signal having a frequency of 29872608.6 Hz is measured. The sampling frequency is 915.8 Hz (=30010024.5/32768). A three-stage moving average filter having 200 taps per stage is used as the low-pass filter 140. The scaling section 150 multiplies the output signal by a conversion coefficient so that the output signal has the same frequency as the measurement signal. As shown in FIG. 3, the measurement value of the frequency of the measurement signal which is the output signal has a value of 29872608.6 Hz.

Figure 4:
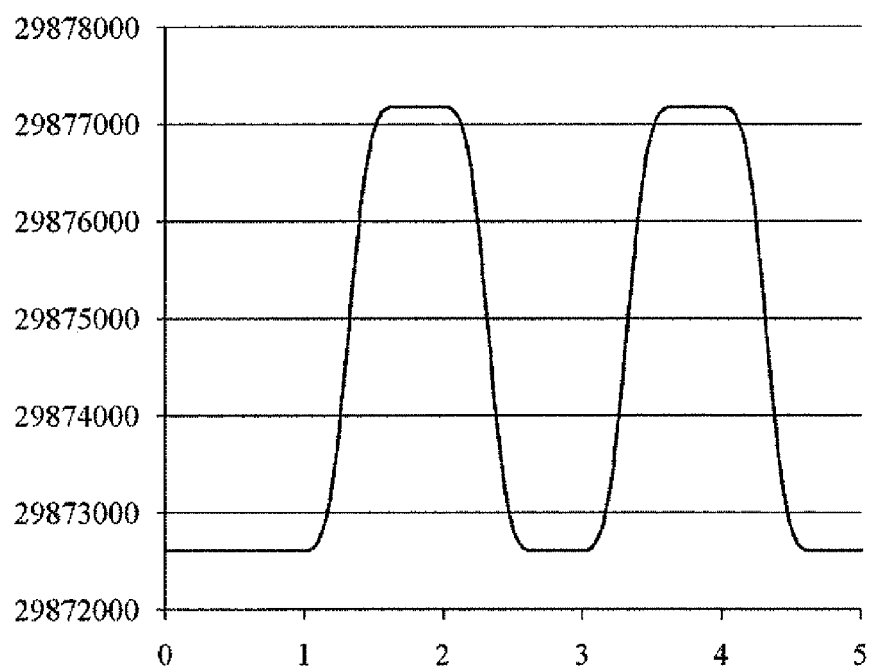
FIG. 4 is a second graph showing the output value of the frequency measurement device according to the comparative example.

FIG. 4 shows the output value of the frequency measurement device of the comparative example when the frequency division ratio is changed alternately between the division ratios of 32768 and 32773 at intervals of one second under the above-described respective conditions. Here, when the frequency division ratio is increased, since the gate period increases, and the sampling frequency decreases, the measured count value per sample decreases. Moreover, as described above, the scaling coefficient is fixed in the frequency measurement device of the comparative example. Therefore, in the output value of the frequency measurement device of the comparative example, the frequency of the measurement signal appears to be increased.

Here, the reason why the frequency of the measurement signal in the output value of the frequency measurement device appears to be increased even if the frequency is not changed as described above is because a transient response occurs since the scaling coefficient is fixed. Therefore, in order to obtain a proper output value even when the frequency division ratio is changed, it is necessary to correct the transient response occurring when the frequency division ratio is changed.

Therefore, the frequency measurement device of the first embodiment includes the coefficient deriving section 200 capable of deriving the scaling coefficient and the scaling section 150 capable of outputting the output value of the low-pass filter 140 by multiplying it by the scaling coefficient. The coefficient deriving section 200 includes the short gate time counter section 160 and the low-pass filter 170 as described above. Since the frequency measurement device of the first embodiment includes the coefficient deriving section 200 and the scaling section 150, it is possible to obtain an output value which is not affected by the transient response even when the frequency division ratio of the frequency divider/multiplier section 120 is changed.

Here, the output value obtained when frequency measurement is performed using the frequency measurement device of the comparative example and the output value obtained when the frequency measurement is performed using the frequency measurement device of the first embodiment will be described in more detail in comparison to each other. The two measurements are performed under the conditions in which dry air is supplied to the vicinity of a crystal vibrator included in the measurement signal source 100, and water vapor is introduced to the vicinity of the crystal vibrator for 60 seconds in a state where a measurement signal having a stable frequency of 2994864 Hz is obtained, and then, dry air is supplied again. In this case, since the crystal vibrator is separated after adsorbing water vapor, the frequency of the measurement signal which is the output value from the frequency measurement device changes.

Figure 5:
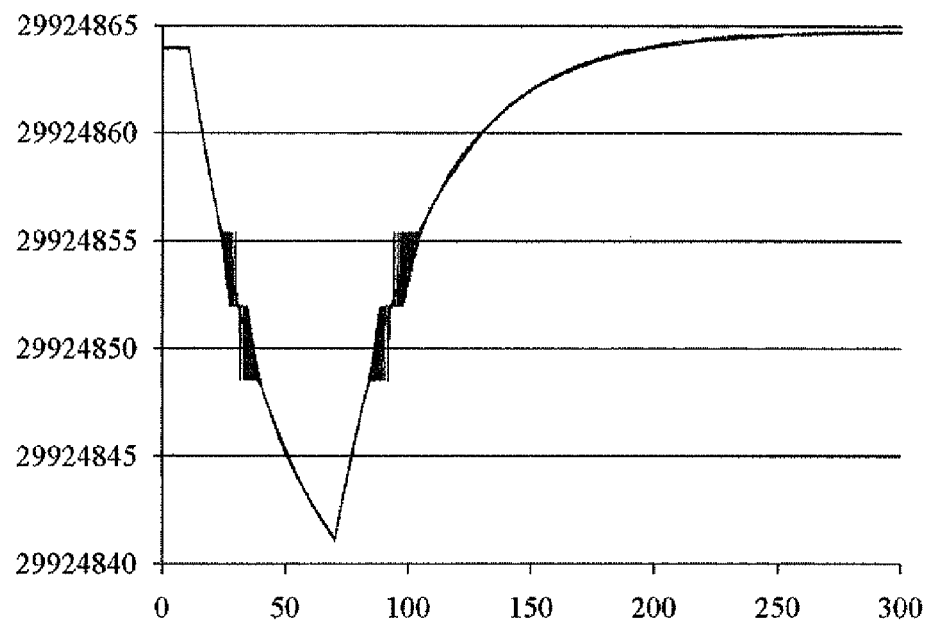
FIG. 5 is a graph showing the output value when frequency measurement is actually performed using the frequency measurement device according to the comparative example.

FIG. 5 is a graph showing the output value when the frequency measurement is performed using the frequency measurement device of the comparative example. In this graph, the horizontal axis represents time, and the vertical axis represents a frequency. As can be understood from FIG. 5, when water vapor is introduced to the vicinity of the crystal vibrator, the frequency decreases by about 20 Hz and then gradually increases. Here, a large idling tone (pattern noise) occurs near the frequency of 29924855 Hz-29924850 Hz. This idling tone occurs near the operating point of 0.00 as will be described in detail below.

Figure 6:
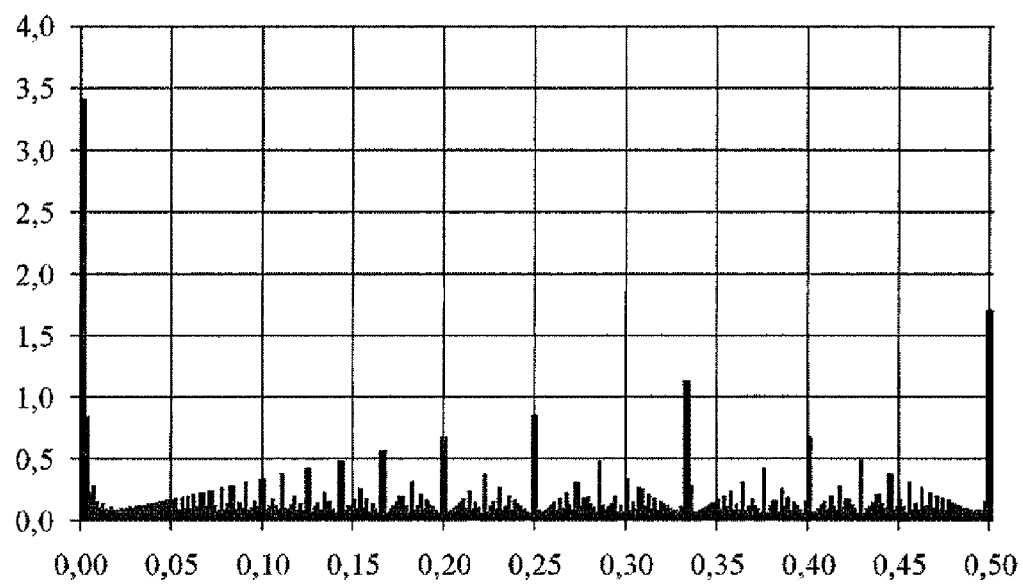
FIG. 6 is a graph showing the relation between the operating point parameter and noise intensity.

FIG. 6 is a graph showing the relation between operating point parameter and noise intensity (noise level).

The operating point parameter is used in order to grasp operation characteristics and is defined as below based on two signals used in the short gate time counter section 130.

Operating point parameter=(Frequency of Measurement signal)/(Frequency of Frequency division/multiplication reference clock)−Int((Frequency of Measurement signal)/(Frequency of Frequency division/multiplication reference clock))

Here, Int(c) is a function representing the integer portion of c. From the definitional equation, it can be understood that the operating point parameter represents the fractional portion of ((Frequency of Measurement signal)/(Frequency of Frequency division/multiplication reference clock)) and assumes a value of 0 or more and less than 1. The noise intensity shown in FIG. 6 is a complex function of the operating point parameter and has symmetry about the operating point parameter of 0.5. That is, the noise intensity at the operating point parameter of 0.5−d is identical to the pattern noise intensity at the operating point parameter of 0.5+d (0<d≤0.5). Therefore, FIG. 6 shows the relation between the operating point parameter and the noise intensity in the operating point parameter range of 0 to 0.5.

Here, the output value when frequency measurement is performed using the frequency measurement device of the comparative example will be examined. The operating point parameter when the frequency of the measurement signal is 29924855 Hz and 29924850 Hz is as below. The operating point parameter is the fractional portion x of the calculation result X below, and the operating point parameter for values greater than 0.5 and equal to or less than 1.0 becomes 1−x.

29924855/(30010024.5/32768)=32675.003

29924850/(30010024.5/32768)=32674.998

As can be understood from the calculation result, in the output value obtained when frequency measurement is performed using the frequency measurement device of the comparative example shown in FIG. 5, an idling tone occurs near the point where the operating point parameter crosses 0.

Next, the case where frequency measurement is performed using the frequency measurement device of the first embodiment will be described.

Figure 7:
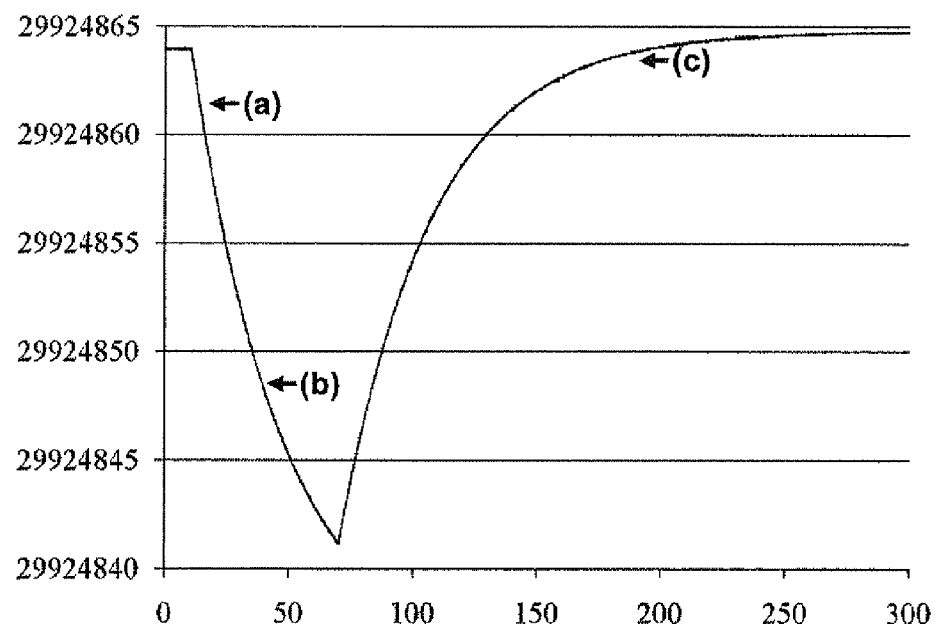
FIG. 7 is a graph showing the output value when frequency measurement is actually performed using the frequency measurement device according to the first embodiment.

FIG. 7 is a graph showing the output value when frequency measurement is performed using the frequency measurement device of the first embodiment. As shown in the graph of FIG. 7, no idling tone occurs in the frequency measurement device of the first embodiment. This is because in the frequency measurement device of the first embodiment, the frequency division or multiplication ratio is controlled by the feedback from the low-pass filter 140 so that the operating point parameter of the frequency divider/multiplier section 120 falls within a prescribed range, namely so that the operating point parameter does not have a value around 0 in the first embodiment. By controlling in this way, it is possible to provide the frequency measurement device capable of continuously preventing the idling tone (pattern noise).

Here, a specific example of a method of controlling the frequency division ratio by the frequency divider/multiplier section 120 will be described.

In this example, the operating point parameter is controlled to be within the range of 0.01 to 0.04, and the frequency division ratio is changed by an amount of ±5 when the operating point parameter deviates from that range. In this case, since the operating point parameter deviates from the range of 0.01 to 0.04 at the points of time (a), (b), and (c) shown in FIG. 7, the frequency division ratio is changed from 32768 to 32763 at the point (a), from 32763 to 32758 at the point (b), and from 32758 to 32763 at the point (c). In this case, the operating point parameter is changed as follows.

At the point (a), the frequency of the measurement signal is changed from 29924864 Hz to 29924861 Hz. Thus, it can be understood that the operating point parameter is changed from 0.132 to 0.0098 based on the following calculations.

$$29924864/(30010024.5/32768)=32675.0132$$

$$29924861/(30010024.5/32768)=32675.0098$$

Therefore, the frequency divider/multiplier section 120 changes the frequency division ratio from 32768 to 32763 at the point in time when the frequency of the measurement signal becomes 29924861 Hz. By doing so, the operating point parameter falls within the range of 0.01 to 0.04 based on the following calculation.

$$29924861/(30010024.5/32763)=32670.0240$$

At the point (b), the frequency of the measurement signal is changed to 29924848 Hz. In this case, the operating point parameter becomes 0.098 based on the following calculation.

$$29924848/(30010024.5/32763)=32670.0098$$

Therefore, the frequency divider/multiplier section 120 changes the frequency division ratio from 32763 to 32758 at the point in time when the frequency of the measurement signal becomes 29924848 Hz. By doing so, the operating point parameter falls within the range of 0.01 to 0.04 based on the following calculation.

$$29924848/(30010024.5/32758)=32665.0240$$

At the point (c), the frequency of the measurement signal is changed to 29924863 Hz. In this case, the operating point parameter becomes 0.0404 based on the following calculation.

$$29924863/(30010024.5/32758)=32665.0404$$

Therefore, the frequency divider/multiplier section 120 changes the frequency division ratio from 32758 to 32763 at the point in time when the frequency of the measurement signal becomes 29924863 Hz. By doing so, the operating point parameter falls within the range of 0.01 to 0.04 based on the following calculation.

$$29924863/(30010024.5/32763)=32670.0262$$

Here, the change in the conversion coefficient which is the output value of the low-pass filter 170 when the frequency division ratio of the frequency divider/multiplier section 120 is changed will be described. In the following description, the reciprocal of the conversion coefficient used in the multiplication in the scaling section 150 is shown in a graph.

Figure 8:
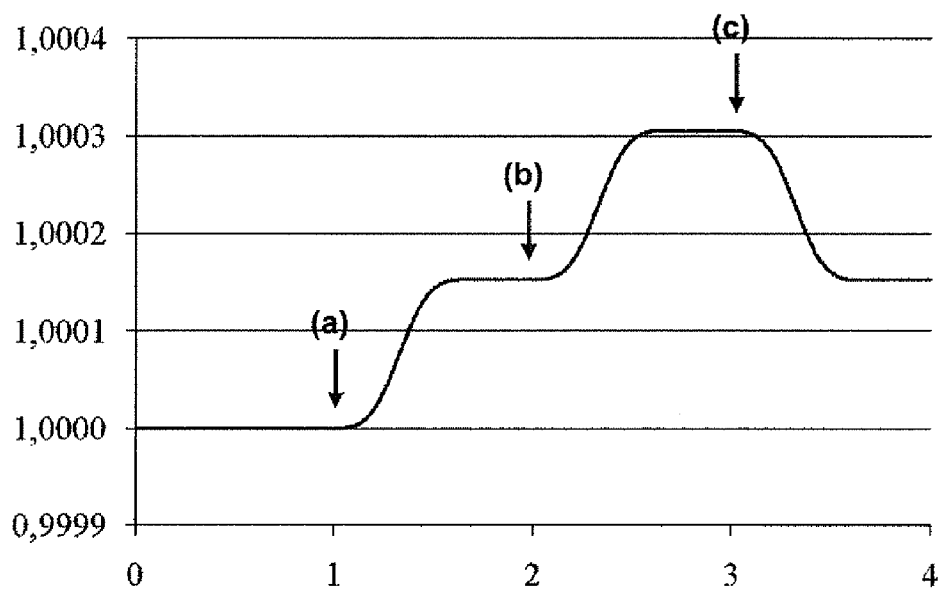
FIG. 8 is a graph showing a change in the reciprocal of a conversion factor output from a low-pass filter.

FIG. 8 is a graph showing the change in the reciprocal of the conversion coefficient output from the low-pass filter 170 when the frequency division ratio is changed from 32768 to 32763 at the point (a), from 32763 to 32758 at the point (b), and from 32758 to 32763 at the point (c). The reciprocal has a value of 1.00 in the initial state. The initial state means the state where the frequency division ratio is 32768. In this example, for better understanding of the graph, the frequency division ratio is changed at intervals of one second.

As can be understood from FIG. 8, the reciprocal of the conversion coefficient increases gradually immediately after the frequency division ratio is decreased and returns to a normal state after a short period of time. In contrast, when the frequency division ratio is increased, the reciprocal of the conversion coefficient decreases gradually immediately after that and returns to a normal state after a short period of time.

The frequency measurement device having the above-described configuration is configured to include the coefficient deriving section 200 and the like. With this configuration, it is possible to appropriately correct the transient response of the output signal which occurs when the frequency division or multiplication ratio of the reference clock (the reference signal) is dynamically changed. Thus, it is possible to measure the frequency of the measurement signal continuously.

Moreover, it is desirable that the frequency measurement device is configured to select the combination of the frequency of the frequency division/multiplication reference clock (the frequency division/multiplication reference signal) and the frequency of the measurement signal so that pattern noise is prevented from increasing. In this case, it is possible to suppress the effect of the pattern noise on the output signal of the frequency measurement device.

Moreover, the coefficient deriving section 200 is configured to include the short gate time counter section 160 and the low-pass filter 170. With this configuration, it is possible to configure the coefficient deriving section 200 and the scaling section (the conversion section) 150 with a relatively simple circuit.

Moreover, in the frequency measurement device of the first embodiment, the frequency division or multiplication ratio is dynamically changed so as to obtain an operating point parameter so that the pattern noise is prevented from increasing. In this way, it is possible to effectively decrease the pattern noise included in the output signal.

3. Second Embodiment

Next, a second embodiment of the invention will be described with reference to FIG. 9.

Figure 9:
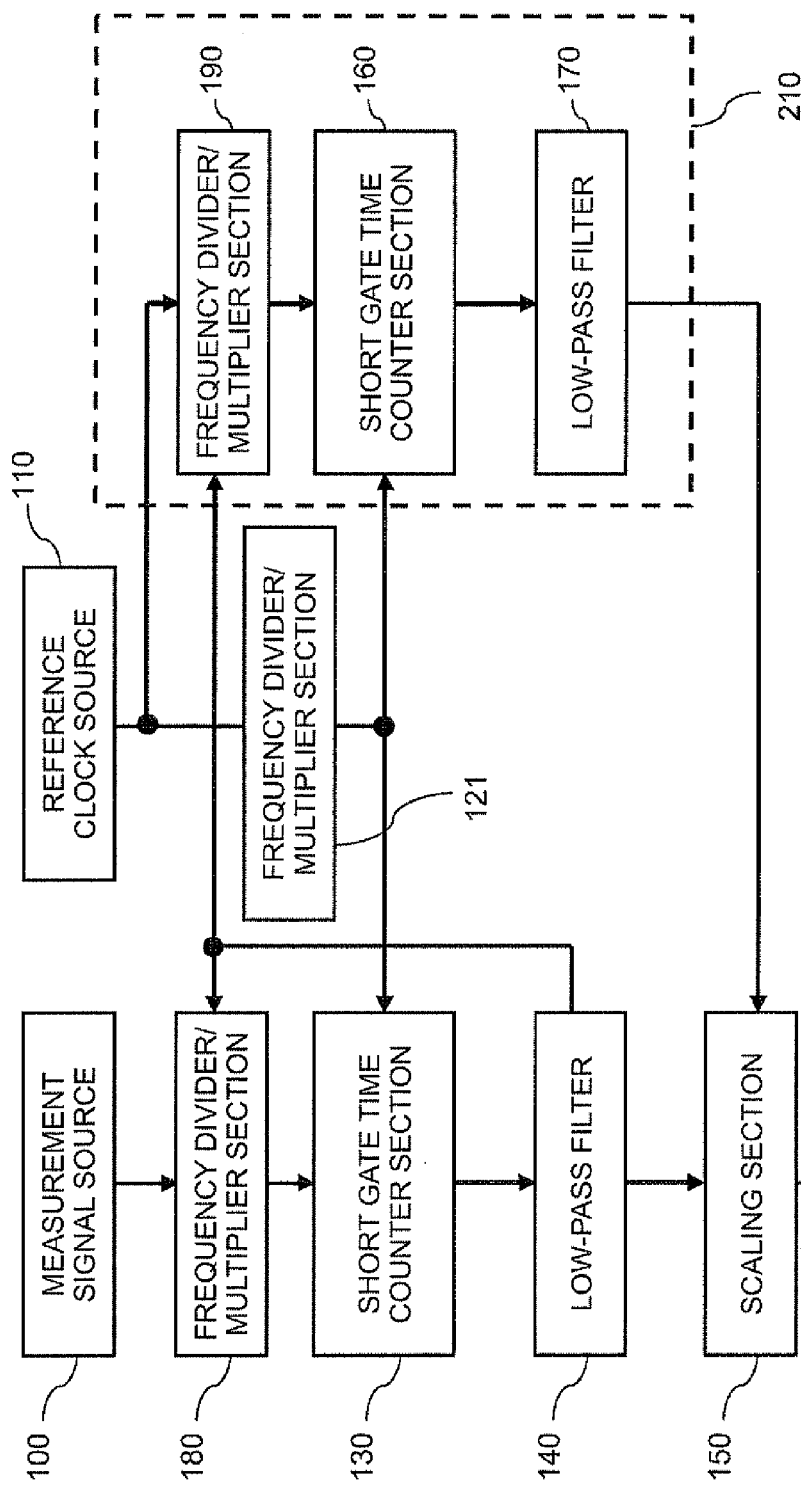
FIG. 9 is a diagram showing the configuration of a frequency measurement device according to a second embodiment.

FIG. 9 is a diagram showing the configuration of the frequency measurement device according to the second embodiment. As shown in FIG. 9, the frequency measurement device is configured to include a measurement signal source 100, a reference clock source 110, a frequency divider/multiplier section 121, a frequency divider/multiplier section 180, a short gate time counter section 130, a low-pass filter 140, a scaling section 150, and a coefficient deriving section 210. The coefficient deriving section 210 is configured to include a frequency divider/multiplier section 190, a short gate time counter section 160, and a low-pass filter 170.

From a comparison between FIGS. 1 and 9, the frequency measurement device of the second embodiment is different from the frequency measurement device of the first embodiment, in that it includes two frequency divider/multiplier sections 180 and 190. Moreover, although the count value is input from the low-pass filter 140 to the frequency divider/multiplier section 121 in the first embodiment, the count value is input to the frequency divider/multiplier sections 180 and 190 in the second embodiment. The other configurations and functions of the second embodiment are the same as those of the first embodiment.

Frequency Divider/Multiplier Section 121

The frequency divider/multiplier section 121 is configured to be capable of generating a frequency division/multiplication reference clock (frequency division/multiplication reference signal) which is obtained by dividing and/or multiplying the reference clock input from the reference clock source 110 by a prescribed frequency division or multiplication ratio.

Frequency Divider/Multiplier Section 180

The frequency divider/multiplier section 180 is configured to be capable of generating a frequency division/multiplication measurement signal which is obtained by dividing and/or multiplying the measurement signal by a variable frequency division or multiplication ratio. The frequency division or multiplication ratio is determined based on a count value fed back from the low-pass filter 140.

Frequency Divider/Multiplier Section 190

The frequency divider/multiplier section 190 is configured to be capable of generating a frequency division/multiplication reference clock (frequency division/multiplication reference signal) which is obtained by dividing and/or multiplying the reference clock by a variable frequency division or multiplication ratio. The frequency division or multiplication ratio is determined based on a count value fed back from the low-pass filter 140. The frequency division or multiplication ratio of the frequency divider/multiplier section 190 is changed in the same proportion as that of the change in the frequency division or multiplication ratio of the frequency divider/multiplier section 180.

According to the frequency measurement device having the above-described configuration, the frequency division/multiplication reference clock supplied to the short gate time counter sections 130 and 160 is constant unlike the frequency measurement device of the first embodiment. In this way, it is possible to stabilize the operation of the frequency measurement device.

According to the configuration described in the second embodiment, it is possible to provide the same function as the first embodiment.

That is, the frequency measurement device of the second embodiment is configured to include the coefficient deriving section 200 and the like. With this configuration, it is possible to appropriately correct the transient response of the output signal which occurs when the frequency division or multiplication ratio of the reference clock (the reference signal) is dynamically changed. Thus, it is possible to measure the frequency of the measurement signal continuously.

Moreover, it is desirable that the frequency measurement device is configured to select the combination of the frequency of the frequency division/multiplication reference clock (the frequency division/multiplication reference signal) and the frequency of the measurement signal so that pattern noise is prevented from increasing. In this case, it is possible to suppress the effect of the pattern noise on the output signal of the frequency measurement device.

Moreover, the coefficient deriving section 200 is configured to include the short gate time counter section 160 and the low-pass filter 170. With this configuration, it is possible to configure the coefficient deriving section 210 and the scaling section (the conversion section) 150 with a relatively simple circuit.

Moreover, in the frequency measurement device of the second embodiment, the frequency division or multiplication ratio is dynamically changed so as to obtain an operating point parameter so that the pattern noise is prevented from increasing. In this way, it is possible to effectively decrease the pattern noise included in the output signal.

4. Supplement

The frequency measurement device according to the invention can be applied to an electronic device such as an odor sensor.

In the above description, although the crystal vibrator is used, the crystal vibrator is not essential but may be replaced with other vibrators.

Moreover, in the frequency measurement device, although the count value is fed back from the low-pass filter 140, the count value may be fed back from the short gate time counter section 130.

Moreover, in the above embodiments, although the case where the frequency divider/multiplier section performs frequency division has been described, the frequency divider/multiplier section may perform frequency multiplication.

Moreover, in the above description, although the operating point parameter is controlled to be within the range of 0.01 to 0.04, the range is only an example, and other ranges may be used.

Moreover, the frequency division ratio and the amount of change in the frequency division ratio when the operating point parameter is out of a prescribed range are not limited to those described in the embodiments, but other values can be appropriately set.

Moreover, in the above embodiments, although the scaling section 150 is configured to multiply the output of the low-pass filter 140 by the reciprocal of the conversion coefficient, the coefficient deriving section may output the conversion coefficient derived as the reciprocal in advance, and the scaling section 150 may multiply the output of the low-pass filter 140 by the conversion coefficient.

Moreover, although one measurement signal source 100 is included in the frequency measurement device, a plurality of measurement signal sources may be included. In this case, each measurement signal source needs to include a short gate time counter section, a low-pass filter, and a scaling section.

What is claimed is:

1. A frequency measurement device that measures a frequency of a measurement signal continuously, comprising:
    a reference signal source that generates a reference signal;
    a frequency divider/multiplier section that generates a frequency division/multiplication reference signal obtained by dividing or multiplying the reference signal by a frequency division ratio or a frequency multiplication ratio;
    a first counter section that outputs a first count value obtained by measuring a number of the rising and/or falling edge of the measurement signal within a prescribed period determined based on the frequency division/multiplication reference signal;
    a first low pass filter that removes a high frequency component included in the first count value;

a coefficient deriving section that derives a conversion coefficient based on the frequency division/multiplication reference signal, the coefficient deriving section including:
  a second counter section that outputs a second count value obtained by measuring a number of the rising and/or falling edge of the reference signal included in a prescribed period determined based on the frequency division/multiplication reference signal; and
  a second low pass filter that outputs the second count value as the conversion coefficient by removing a high frequency component included in the second count value;
a conversion section that multiplies an output value of the first low pass filter by the conversion coefficient or a reciprocal of the conversion coefficient, the conversion section multiplying the output value of the first low pass filter by the reciprocal of the conversion coefficient; and
the frequency divider/multiplier section changing the frequency division ratio or the frequency multiplication ratio dynamically so that a value of an operating point parameter defined by a fractional portion of a ratio x/y of a frequency x of the measurement signal to a frequency y of the frequency division/multiplication reference signal is changed to be within a predefined range.

2. An electronic device comprising the frequency measurement device according to claim 1.

3. The frequency measurement device according to claim 1, wherein the predefined range is 0.01 to 0.04.

4. A frequency measurement device that measures a frequency of a measurement signal continuously, comprising:
  a reference signal source that generates a reference signal;
  a first frequency divider/multiplier section that generates a frequency division/multiplication measurement signal obtained by dividing or multiplying the measurement signal by a first frequency division ratio or a first multiplication ratio;
  a first counter section that outputs a first count value obtained by measuring a number of the rising and/or falling edge of the frequency division/multiplication measurement signal included in a prescribed period determined based on the reference signal;
  a first low pass filter that removes a high frequency component included in the first count value;
  a coefficient deriving section that derives a conversion coefficient based on the frequency division/multiplication measurement signal, the coefficient deriving section including:
    a second frequency divider/multiplier section that generates a frequency division/multiplication reference signal obtained by dividing or multiplying the reference signal by a second frequency division ratio or a second multiplication ratio;
    a second counter section that outputs a second count value obtained by measuring the rising and/or falling edge of the reference signal included in a prescribed period determined based on the frequency division/multiplication reference signal; and
    a second low pass filter outputting the second count value as the conversion coefficient by removing a high-frequency component included in the second count value;
  a conversion section that multiplies an output value of the first low pass filter by the conversion coefficient or a reciprocal of the conversion coefficient, the conversion section multiplying the output value of the first low pass filter by the reciprocal of the conversion coefficient; and
  the first frequency divider/multiplier section and the second frequency divider/multiplier section changing the first frequency division ratio or the first frequency multiplication ratio, and changing the second frequency division ratio or the second multiplication ratio dynamically so that a value of an operating point parameter defined by a fractional portion of a ratio x/y of a frequency x of the frequency division/multiplication measurement signal to a frequency of the reference signal is changed to be within a predefined range.

5. An electronic device comprising the frequency measurement device according to claim 4.

6. The frequency measurement device according to claim 4, wherein the predefined range is 0.01 to 0.04.

* * * * *